(12) United States Patent
Huang et al.

(10) Patent No.: US 12,057,820 B2
(45) Date of Patent: Aug. 6, 2024

(54) THIN FILM PIEZOELECTRIC ACOUSTIC WAVE RESONATOR AND MANUFACTURING METHOD THEREFOR, AND FILTER

(71) Applicant: NINGBO SEMICONDUCTOR INTERNATIONAL CORPORATION, Zhejiang (CN)

(72) Inventors: Herb He Huang, Zhejiang (CN); Hailong Luo, Zhejiang (CN); Wei Li, Zhejiang (CN); Fei Qi, Zhejiang (CN)

(73) Assignee: NINGBO SEMICONDUCTOR INTERNATIONAL CORPORATION, Zhejiang (CN)

( * ) Notice: Subject to any disclaimer, the term of this patent is extended or adjusted under 35 U.S.C. 154(b) by 384 days.

(21) Appl. No.: 17/629,936

(22) PCT Filed: Jul. 1, 2020

(86) PCT No.: PCT/CN2020/099640
§ 371 (c)(1),
(2) Date: Jan. 25, 2022

(87) PCT Pub. No.: WO2021/120590
PCT Pub. Date: Jun. 24, 2021

(65) Prior Publication Data
US 2022/0294414 A1  Sep. 15, 2022

(30) Foreign Application Priority Data

Dec. 16, 2019 (CN) .......................... 201911294388.X

(51) Int. Cl.
*H03H 9/17* (2006.01)
*H03H 3/02* (2006.01)
(Continued)

(52) U.S. Cl.
CPC ............... *H03H 9/17* (2013.01); *H03H 3/02* (2013.01); *H03H 9/05* (2013.01); *H03H 9/13* (2013.01); *H03H 9/54* (2013.01)

(58) Field of Classification Search
CPC ........ H03H 9/54; H03H 9/173; H03H 9/0561; H03H 9/13; H03H 9/05; H03H 3/02; H03H 9/17
See application file for complete search history.

(56) References Cited

U.S. PATENT DOCUMENTS

| 2019/0074816 A1* | 3/2019 | Mizuguchi | H03H 3/02 |
| 2022/0321093 A1* | 10/2022 | Huang | H03H 9/02157 |
| 2023/0084409 A1* | 3/2023 | Kim | H03H 9/02015 |
| | | | 333/188 |

FOREIGN PATENT DOCUMENTS

| CN | 101024481 A | 8/2007 |
| CN | 103607178 A | 2/2014 |

(Continued)

*Primary Examiner* — Quan Tra
(74) *Attorney, Agent, or Firm* — Browdy and Neimark, PLLC

(57) ABSTRACT

A thin film piezoelectric acoustic wave resonator and a manufacturing method therefor, and a filter. The thin film piezoelectric acoustic wave resonator includes: a first base, an upper electrode, a piezoelectric plate body, a lower electrode and an isolation cavity. The upper electrode, the piezoelectric plate body and the lower electrode are arranged on an upper surface of the first base and are stacked sequentially from top to bottom. The upper electrode, the piezoelectric plate body and the lower electrode have an overlapping region in a direction perpendicular to the surface of the piezoelectric plate body, in which a first gap is formed between the piezoelectric plate body and the upper electrode, and a second gap is formed between the piezoelectric plate body and the lower electrode. The isolation cavity surrounds the periphery of the piezoelectric plate (Continued)

body and connects the first and second gaps together. At least one connecting bridge is arranged between the piezoelectric plate body and the base.

20 Claims, 6 Drawing Sheets

(51) Int. Cl.
*H03H 9/05* (2006.01)
*H03H 9/13* (2006.01)
*H03H 9/54* (2006.01)

(56) References Cited

FOREIGN PATENT DOCUMENTS

| CN | 103930979 | A | | 7/2014 |
|----|-----------|---|---|--------|
| CN | 109474252 | A | | 3/2019 |
| CN | 110166018 | A | | 8/2019 |
| CN | 110401428 | A | | 11/2019 |
| CN | 112787613 | A | * | 5/2021 |
| JP | 2008109573 | A | | 5/2008 |

* cited by examiner

THIN FILM PIEZOELECTRIC ACOUSTIC WAVE RESONATOR AND MANUFACTURING METHOD THEREFOR, AND FILTER

FIELD OF TECHNOLOGY

The invention relates to the field of manufacturing of semiconductor devices, in particular to a thin film piezoelectric acoustic wave resonator and a manufacturing method thereof, and a filter.

BACKGROUND

Acoustic wave resonators based on piezoelectric induction are divided into a surface acoustic wave resonator (SAWR) and a bulk acoustic wave resonator (BAWR), which are the basic elements of radial frequency filters, and the radial frequency filter is a core device of the wireless communication radial frequency front end and base station system nowadays. The bulk acoustic wave resonator has excellent characteristics of low insertion loss, high quality factor and the like, especially has obvious advantages at the frequency of more than 2.0 GHz compared with the surface acoustic wave resonator.

As shown in FIG. 1, the traditional film bulk acoustic resonator (FBAR) consists of a thin film piezoelectric plate body R40 arranged on a base R10, and an upper electrode plate R30 and a lower electrode plate R50 of which the upper surface R41 and the lower surface R42 are physically "welded" together, and the overlapping part of the upper electrode plate R30 and the lower electrode plate R50 is placed above a cavity R20 on the base. Under the action of the alternating electric field generated by the upper and lower electrode plates, bulk acoustic wave elastic vibration in a longitudinal direction R1 and a transverse direction R2 will be generated in and on the surface of the thin piezoelectric plate body R40. Since the upper electrode plate R30 and the lower electrode plate R50 are physically "welded" on the upper surface R41 and the lower surface R42 of the thin film piezoelectric plate body R40, the bulk acoustic wave elastic vibration will naturally be transmitted to the upper electrode plate R30 and the lower electrode plate R50 and be propagated outwards along the upper electrode plate R30 and the lower electrode plate R50. Therefore, quite a part of the bulk acoustic wave elastic vibration and its energy generated on the piezoelectric plate body R40 through the action of the alternating electric field generated by the upper electrode plate R30 and the lower electrode plate R50 will be dissipated out of the piezoelectric plate body and consumed. In particular, when the thickness of the piezoelectric plate body R40 is reduced (higher longitudinal resonant frequency has been obtained), and the area of the piezoelectric plate body R40, the upper electrode plate R30 and the lower electrode plate R50 are increased, the proportion of the consumed bulk acoustic wave increases, thereby further negatively affecting the performance of the bulk acoustic wave resonator. However, under the basic device structure of the traditional and existing bulk acoustic wave resonators, it is inevitable that the bulk acoustic wave dissipates from the piezoelectric plate body R40 to the upper electrode plate R30 and the lower electrode plate R50 to result in the loss of the bulk acoustic wave vibration energy. In addition, longitudinal acoustic wave oscillation is reflected on the upper and lower interfaces R41 and R42 of the upper electrode plate R30, the lower electrode plate R50 and the piezoelectric plate body R40, and the interfaces R31 and R51 of the upper electrode plate R30, the lower electrode plate R50 and the air, and the generated subhannonic wave will also become a part of noise. Moreover, due to the presence of the upper electrode plate R30 and the lower electrode plate R50, the piezoelectric induction resonant frequency not only depends on the thickness and the longitudinal acoustic wave velocity of the piezoelectric plate body, but also on the influence of the acoustic wave reflection and the elastic stiffness of the upper and lower electrodes. The negative influence from the basic structure of the device will be further aggravated with the further increase of the required resonant frequency and the further reduction of the thickness of the piezoelectric plate body. Furthermore, two thin film electrodes are in direct contact with a piezoelectric thin film layer. On one hand, due to different physical properties of different materials, including difference change of the physical properties of the material caused by temperature change, residual stress, and interface reflection on longitudinal and transverse acoustic waves will generate at the interface; and on the other hand, the acoustic wave in the piezoelectric thin film layer is propagated into the thin film electrode, resulting in loss of the acoustic wave energy.

The thickness of the piezoelectric plate body, electrode or dielectric layer and the sound velocity therein change with the temperature change, so the resonant frequency of the piezoelectric acoustic wave resonator changes with the temperature change. At present, most of materials applied to the piezoelectric acoustic wave resonator show negative temperature coefficient of sound velocity, that is, the sound velocity will decrease with the increase of the temperature. For example, the temperature coefficient of sound velocity of aluminum nitride is −25 ppm/° C., and the sound velocity temperature coefficient of molybdenum is −60 ppm/° C. The radio frequency (RF) filter formed by the piezoelectric acoustic wave resonator generally has a passband frequency response, the temperature coefficient of frequency (TCF) of the piezoelectric acoustic wave resonator will reduce the manufacturing yield of the RF filter because equipment or a device formed by the piezoelectric acoustic wave resonator only can meet the requirement of passband bandwidth within a certain temperature range. In the application of most of required duplexers, in order to meet the requirement in a wider temperature range, low temperature coefficient of frequency is very important.

As shown in FIG. 2, the improved thin film bulk acoustic wave resonator includes: a first electrode R120 located on a base R110, a piezoelectric layer R140 located above the first electrode R120, a second electrode R160 located above the piezoelectric layer R140 and an acoustic reflection structure R115 located below the first electrode R140, wherein at least one gap R130 or R150 is formed between the second electrode R160 and the first electrode 140, the gap at least partially covers an effective region (the effective region is an overlapping region of the first electrode R1220, the second electrode R160 and the piezoelectric layer R140 in a thickness direction) of the thin film bulk acoustic wave resonator, and a projection in a vertical direction all falls within the acoustic reflection structure R115. The improved thin film bulk acoustic wave resonator may effectively eliminate longitudinal acoustic wave generated by the piezoelectric layer R140 from being directly transmitted to the upper and lower electrodes (that is, the first electrode R120 and the second electrode R160) in a longitudinal direction R101; however, in a horizontal direction R102, due to the physical effect of the piezoelectric material of the piezoelectric layer R140, the longitudinal bulk acoustic wave generated under the action of the alternating electric field of the upper and lower electrodes will inevitably lead to transverse bulk acoustic wave vibration and be propagated to the boundary of the effective region to form partial reflection, but it is inevitable that quite a part of transverse acoustic wave is propagated to the piezoelectric layer and the upper and lower electrodes outside the effective region to be consumed. In addition, a structure that the upper and lower electrodes and the piezoelectric layer include a gap (at least one gap R130 or R150) disclosed by the improved resonator is formed by chemically releasing a sacrificial layer (such as silicon oxide), wherein a height of the gap is given to be between 1 nm and 500 nm. Generally, a size of the effective region is tens of microns or even larger, so it is quite difficult to remove all the sacrificial layer materials effectively through chemical release.

Therefore, how to improve the physical difference of a contact interface between the piezoelectric thin film and the thin film electrode and reduce the loss of acoustic wave energy in the acoustic wave piezoelectric thin film caused by the electrode, and how to provide a better method for forming the bulk acoustic wave resonator are the main problems at present.

SUMMARY

The present invention discloses a thin film piezoelectric acoustic wave resonator and a manufacturing method therefor, and a filter. The problems in the prior art that residual stress exists on the contact interface of the piezoelectric thin film and the electrode and the acoustic wave is leaked from the electrode and the piezoelectric thin film are solved.

To solve the above technical problem, the present invention provides a thin film piezoelectric acoustic wave resonator, including:
  a first base;
  an upper electrode, a piezoelectric plate body and a lower electrode, arranged on an upper surface of the first substrate and stacked sequentially from top to bottom, wherein the upper electrode, the piezoelectric plate body and the lower electrode are provided with an overlapping region in a direction perpendicular to the surface of the piezoelectric plate body, and
  in the overlapping region, a first gap is formed between the piezoelectric plate body and the upper electrode, and a second gap is formed between the piezoelectric plate body and the lower electrode; and
  an isolation cavity, surrounding the periphery of the piezoelectric plate body, wherein at least one connecting bridge is arranged between the piezoelectric plate body and the substrate, and
  the first gap communicates with the second gap through the isolation cavity.

The present invention further provides a filter, including a plurality of the resonators.

The present invention further provides a manufacturing method for a thin film piezoelectric acoustic wave resonator. The manufacturing method includes:
  providing a first substrate;
  forming an upper electrode on the first substrate;
  forming a laminated structure on the upper electrode, wherein the laminated structure comprises: a piezoelectric plate body, a first sacrificial layer located on an upper surface of the piezoelectric plate body, a second sacrificial layer located on a lower surface of the piezoelectric plate body, a third sacrificial layer located at the periphery of the piezoelectric plate body, and at least one connecting bridge connected with the first substrate and the piezoelectric plate body, and the first sacrificial layer and the second sacrificial layer are connected together through the third sacrificial layer;
  forming an lower electrode on the laminated structure; and
  removing the first sacrificial layer, the second sacrificial layer and the third sacrificial layer to form a first gap located between the piezoelectric plate body and the lower electrode, a second gap located between the piezoelectric plate body and the upper electrode and an isolation cavity located at the periphery of the piezoelectric plate body, wherein
  the upper electrode, the piezoelectric plate body and the lower electrode is provided with an overlapping region in a direction perpendicular to a surface of the first substrate, the first gap and the second gap are at least partially located in the overlapping region, and the overlapping region is defined as an effective working region.

Beneficial effects of the present invention are as follows: according to the present invention, in the effective working region of the thin film acoustic wave resonator, a tiny gap is formed between the piezoelectric plate body and the upper and lower electrodes, electric fields of the upper and lower electrodes may pass through the gap and may be applied to the piezoelectric plate body, the isolation cavity is formed at the periphery of the piezoelectric plate body, and the piezoelectric plate body and the first substrate are connected through a connecting bridge for supporting the piezoelectric plate body. The problems that residual stress exists on the contact interface of the piezoelectric plate body and the upper and lower electrodes and the acoustic wave energy is leaked from the boundary of the piezoelectric plate body and the electrode are solved. In addition, the gap between the piezoelectric plate body and the upper and lower electrodes forms a reflection interface of acoustic wave. When longitudinal acoustic wave in the piezoelectric plate body is propagated to the air interface where the gap is located, the acoustic wave is reflected back into the piezoelectric plate body, thereby reducing loss of the longitudinal acoustic wave. The isolation cavity exposes the boundary of the piezoelectric plate body in the air. When transverse acoustic wave of the piezoelectric plate body is transmitted to the boundary of the piezoelectric plate body, the air interface in the isolation cavity reflects the acoustic wave back into the piezoelectric plate body, thereby reducing loss of transverse acoustic wave. The isolation cavity and the gap communicate with each other, thereby increasing the contact area of the piezoelectric plate body and the air interface, reducing the loss of acoustic wave energy better and improving the quality factor of the resonator.

Further, part of the boundary of the lower electrode is cut off in the region surrounded by the isolation cavity, and the lower electrode has no overlapping region with the upper electrode in the vertical direction, thereby reducing the parasitic effect. Moreover, when the acoustic wave is transmitted into the lower electrode and the acoustic wave in the lower electrode is transmitted to an end part of the lower electrode located below the isolation cavity, the air interface reflects the acoustic wave back into the lower electrode, thereby reducing the loss of the acoustic wave and improving the quality factor of the resonator.

Further, the cap layer is arranged on the surface of the electrode (such as the upper electrode) provided with the through hole to isolate the cavity from the external environment, such that the piezoelectric layer and the tiny gap may be protected from being affected by external substances. In addition, the cap layer and the upper electrode are combined to enhance the structural strength of the upper electrode and increase the yield of the resonators.

Further, at the first conductive plug side, the upper and lower electrodes do not have opposite parts, thereby avoiding parasitic effect; and the second conductive plug electrically connects the upper and lower electrodes outside the effective working region of the resonator, such that the upper and lower electrodes are short-circuited and there is no potential difference above and below the piezoelectric plate body, thereby reducing the parasitic effect of the overlapping region (the upper electrode, the piezoelectric plate body and the lower electrode) outside the effective resonance region.

Further, the first active micro-device and/or the first passive micro-device are integrated in the first base, so that the integration degree of the device may be increased.

Further, the sacrificial layers in the first gap, the second gap and the isolation cavity are all made of amorphous carbon, and the through hole is formed above the sacrificial layer material, so that the sacrificial material may be removed at one time conveniently.

Further, an acoustic wave temperature coefficient compensation layer with a positive temperature coefficient is arranged on the upper or lower surface of or in the piezoelectric plate body so as to reduce the change of the frequency of the resonator with the change of the temperature, control the thickness of the acoustic wave temperature coefficient compensation layer and make the resonator realize temperature compensation without reducing an electromechanical coupling coefficient as much as possible.

According to the present invention, the method for forming the resonator is high in process reliability and simple in flow.

BRIEF DESCRIPTION OF THE DRAWINGS

By describing the exemplary embodiments of the present invention below in more detail in combination with the accompanying drawings, the above and other objectives, characteristics and advantages of the present invention will be more apparent. In the exemplary embodiments of the present invention, the same reference numeral typically represents the same component.

DESCRIPTION OF REFERENCE NUMERALS

Figure 1:
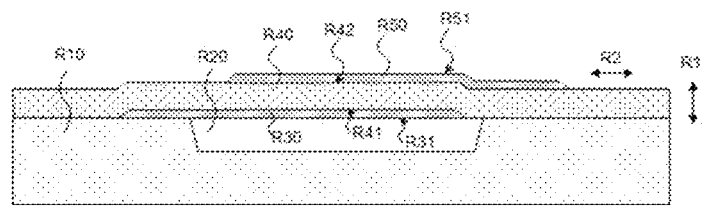
FIG. 1 shows a structural schematic diagram of an existing thin film piezoelectric acoustic wave resonator.

In FIG. 1,
R10-base; R20-cavity; R30-upper electrode plate; R50-lower electrode plate; R40-thin film piezoelectric plate body; R41-upper surface; R42-lower surface; R31-air interface; R51-air interface.

Figure 2:
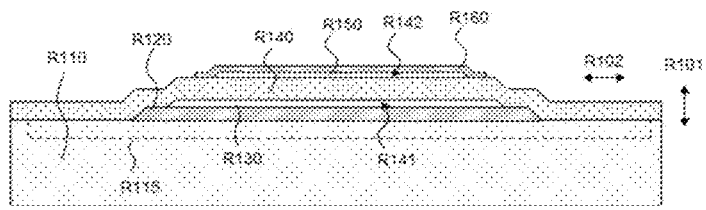
FIG. 2 shows a structural schematic diagram of another existing thin film piezoelectric acoustic wave resonator.

In FIG. 2,
R110-base; R120-first electrode; R140-piezoelectric layer; R160-second electrode; R115-acoustic reflection structure; R130-gap; R150-gap; R141-air interface; R142-air interface.

In FIG. 3 to FIG. 26,
50-first base; 41-first dielectric layer; 31-second dielectric layer; 30-piezoelectric plate body; 21-third dielectric layer; 20-upper electrode; 40-lower electrode; 61-first conductive plug; 62-second conductive plug; 63-third conductive plug; 311-first gap; 33-trench; 34-third sacrificial layer; 35-first sacrificial layer; 36-acoustic wave temperature compensation plate body; 211-second gap; 23-second sacrificial layer; 300-isolation cavity; 301-connecting bridge; 302-end part; 303-effective working region outer side; 13-through hole; 14-isolation groove; 12-top film layer; 11-fourth dielectric layer; 110-cap layer; 32-first groove; 22-second groove; 60-second substrate; 70-micro-device; 71-MIM capacitor; 72-MOS transistor; 73-electrical inductor.

DESCRIPTION OF THE EMBODIMENTS

The present invention will be further described below in detail with reference to the accompanying drawings and the specific embodiments. According to the following description and the accompanying drawings, the advantages and features of the present invention will be clearer. However, it should be noted that the concept of the technical solution of the present invention may be implemented according to various different forms, and is not limited to the specific embodiments described herein. The accompanying drawings all adopt very simplified forms and use inaccurate scale, which are only used for conveniently and clearly assisting in describing the objective of the embodiment of the present invention.

It should be understood that when an element or layer is referred to as "on", "adjacent to", "connected to" or "coupled to" other elements or layers, the element or layer may be directly on, adjacent to, connected to or coupled to other elements or layers, or there may be an element or layer between the element or layer and other elements or layers. On the contrary, when an element is referred to as "directly on", "directly adjacent to", "directly connected to" or "directly coupled to" other elements or layers, there is no element or layer between the element or layer and other elements or layers. It should be understood that although terms first, second, third, etc. may be used to describe various elements, parts, regions, layers and/or portions, these elements, parts, regions, layers and/or portions should not be limited by these terms. These terms are only used to distinguish one element, part, region, layer or portion from another element, part, region, layer or portion. Therefore, without departing from the instruction of the present invention, a first element, part, region, layer or portion discussed below may be represented as a second element, part, region, layer or portion.

Spatial relationship terms such as "under", "below", "over", "above", etc. may be used herein for the convenience of description so as to describe a relationship between one element ore feature shown in the drawings and other elements or features. It should be understood that in addition to an orientation shown in the drawings, the spatial relationship terms are intended to further include different orientations of devices during use and operation. For example, if devices in the drawings are turned over, an element or feature which is described to be "below" or "under" other elements or features will be oriented to be "above" other elements or features. Therefore, exemplary terms "under" and "below" may include upper and lower orientations. Devices may be otherwise oriented (rotating by 90 degrees or adopting other orientations), and spatial description words used therein are accordingly explained.

The terms used herein are only intended to describe the specific embodiments and not to limit the present invention. When used herein, the singular forms "a", "an" and "the" are also intended to include the plural forms, unless the context clearly indicates otherwise. It should also be understood that terms "comprise" and/or "include", when used in the specification, are used to determine the presence of the feature, integer, step, operation, element and/or part, but do not exclude the presence or addition of more other features, integers, steps, operations, elements, parts and/or groups. When used herein, the term "and/or" includes any and all combinations of related listed items.

If the method of the present invention includes a series of steps, the order of these steps presented herein is not necessarily the only order in which these steps may be performed, and some steps may be omitted and/or some other steps not described herein may be added to the method. If elements in a certain drawing are as same as elements in other drawings, these elements may be easily identified, but in order to make the description of the drawings clearer, the description will not mark the reference numerals of all the same elements in each drawing.

Figure 3:
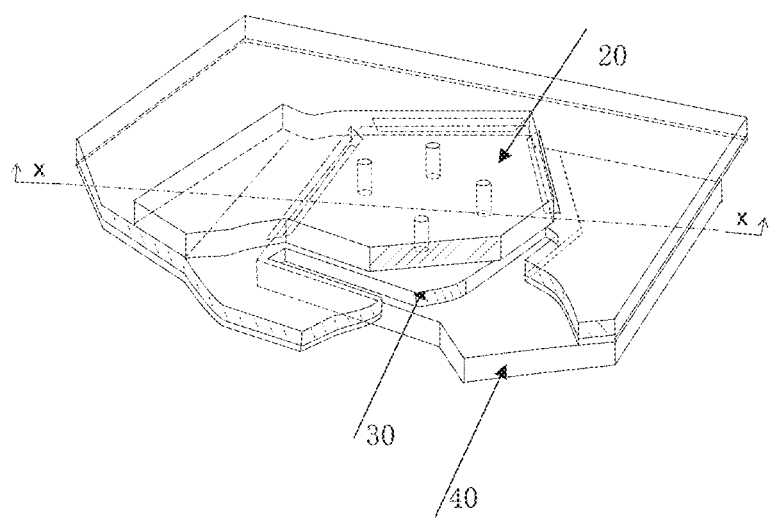
FIG. 3 shows a three-dimensional schematic diagram of a thin film piezoelectric acoustic wave resonator according to a first embodiment of the present invention, which mainly shows the main three-layer structure of the resonator.
Figure 4:
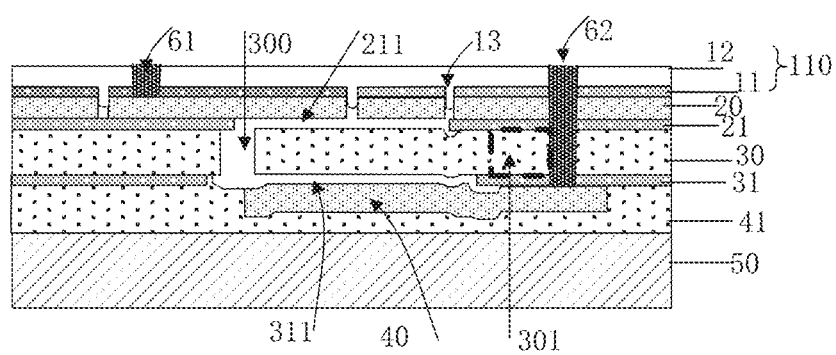
FIG. 4 is a sectional view of FIG. 3 along an X-X direction.

Embodiment I, a first thin film piezoelectric acoustic wave resonator:

An embodiment of the present invention provides a thin film piezoelectric acoustic wave resonator. FIG. 3 shows a simplified three-dimensional schematic diagram of a thin film piezoelectric acoustic wave resonator according to an embodiment of the present invention. FIG. 4 is a sectional view of FIG. 3 along an X-X direction. Referring to FIG. 3 and FIG. 4, the thin film piezoelectric acoustic wave resonator includes: a first base 50; an upper electrode 20, a piezoelectric plate body 30 and a lower electrode 40, arranged on an upper surface of the first base 50 and stacked sequentially from top to bottom, wherein the upper electrode 20, the piezoelectric plate body 30 and the lower electrode 40 are provided with an overlapping region in a direction perpendicular to the surface of the piezoelectric plate body 30, and in the overlapping region, a second gap 211 is formed between the piezoelectric plate body 30 and the upper electrode 20, and a first gap 311 is formed between the piezoelectric plate body 30 and the lower electrode 40; and an isolation cavity 300, surrounding the periphery of the piezoelectric plate body 30, wherein at least one connecting bridge 301 (shown in a dashed box) is arranged between the piezoelectric plate body 30 and the first base 50.

The working principle of the bulk acoustic wave resonator is that the piezoelectric plate body 30 generates vibration under the alternating electric field, the vibration excites bulk acoustic wave propagated along a thickness direction of the piezoelectric plate body 30, and the acoustic wave is reflected back when being propagated to the reflection interface so as to be reflected back and forth in the piezoelectric plate body 30 to form oscillation. When the acoustic wave is propagated in the piezoelectric plate body 30 exactly at odd times of half wavelength, standing wave oscillation is formed. The overlapping region of the upper electrode 20, the piezoelectric plate body 30 and the lower electrode 40 in a direction perpendicular to the surface of the piezoelectric plate body 30 is a region where bulk acoustic wave is generated, which is referred to as the effective working area hereinafter.

Referring to FIG. 4, when a radio frequency alternating voltage signal is applied to the upper electrode 20 and the lower electrode 40, a power line needs to pass through the first gap 311, the piezoelectric plate body 30 and the second gap 211; therefore, the height of the first gap 311 and the second gap 211 is critical, generally between 0.1 nm and 5 microns. Specifically, the most suitable height of the first gap 311 and the second gap 211 is based on the principle that the upper electrode 20 and the lower electrode 40 as well as the piezoelectric plate body 30 can realize maximum piezoelectric interactive induction, and it is necessary to ensure that the upper or lower surface of the piezoelectric plate body 30 will not touch the upper electrode 20 and the lower electrode 40 when the piezoelectric plate body 30 generates piezoelectric acoustic wave vibration. Too large gap will weaken the coupling between the upper and lower electrodes and the piezoelectric plate body; and too small gap will lead to the acoustic wave vibration of the piezoelectric plate body, especially the vibration in the vertical direction, resulting in that the piezoelectric plate body touches the surfaces of the upper and lower electrodes. The first gap 311 and the second gap 211 form the reflection interface of the acoustic wave. When the longitudinal acoustic wave in the piezoelectric plate body 30 is propagated to the air interface where the first gap 311 or the second gap 211 is located, the acoustic wave will be reflected back into the piezoelectric plate body 30, thereby reducing the loss of the longitudinal acoustic wave and improving the quality factor of the resonator. Due to the presence of the first gap 311, the lower electrode is not in contact with the piezoelectric plate body, and the requirement on the flatness of the upper surface of the lower electrode, such that the process requirement on the lower electrode 40 may be reduced and the process step of adjusting the surface thickness of the upper surface of the lower electrode is omitted. The fact that the first gap 311 and the second gap 211 are located in the effective working region may be understood that: the first gap 311 and the second gap 211 are formed in partial region of the effective working region, or the first gap 311 and the second gap 211 are formed in the whole effective working region.

The isolation cavity 300 is configured to separate the piezoelectric plate body 30, so that part of the edge of the piezoelectric plate body 30 is exposed in the isolation cavity 300. When the acoustic wave is transmitted to the boundary of the piezoelectric plate body 30, the acoustic wave is reflected back into the piezoelectric plate body 30 by the air interface of the isolation cavity 300, thereby reducing transverse leakage of the acoustic wave and improving the quality factor of the resonator. The shape of the edge of the piezoelectric plate body 30 exposed in the isolation cavity 300 includes an arc or a straight line, for example, the shape of the edge may consist of one or more arcs, or be a combination of the arc and the straight line, or consist of a plurality of straight lines. The edge of the piezoelectric plate body 30 mentioned herein is an edge of the piezoelectric plate body 30 located in the effective working region. The piezoelectric plate body in the effective working region may be optionally an irregular polygon, and any two sides of the polygon are not parallel. In this embodiment, the isolation cavity 300 is a continuous whole body and surrounds the edge of part of the piezoelectric plate body 30, and a part of the piezoelectric plate body not surrounded by the isolation cavity 300 and extending above the first base 50 forms a connecting bridge 301. In another embodiment, the isolation cavity 300 includes a plurality of spaced sub-cavities, and a part of the piezoelectric plate body 30 between the adjacent sub-cavities extending above the first base 50 forms a connecting bridge 301. The connecting bridge is configured to connect and fix the piezoelectric plate body 30 on the first base 50. The distribution and shape of the connecting bridge may be based on the fact that the piezoelectric plate body 30 may be stably supported. There are many forms, for example, the isolation cavity 300 enables the edge of the piezoelectric plate body 30 to form a pentagon, and the connecting bridge 301 is located at five vertex angles of the pentagon. In the present invention, the isolation cavity may also be a cavity which is closed along a circumferential direction. In this case, the connecting bridge may span over the isolation cavity and is connected between the piezoelectric plate body and the first base. At this time, the periphery of the piezoelectric plate body is in contact with the air, such that leakage acoustic wave leakage may be avoided better. In this embodiment, the isolation cavity 300, the first gap 311 and the second gap 211 communicate with each other. When the isolation cavity 300, the first gap 311 and the second gap 211 are formed, it is necessary to fill a sacrificial layer therein. When the three spaces communicate with each other, the sacrificial layers in the three spaces may be removed at one time, thereby simplifying the process flow. In addition, the isolation cavity 300, the first gap 311 and the second gap 211 communicate with each other, such that the contact area of the piezoelectric plate body 30 and the air interface is increased, the loss of the acoustic wave energy may be reduced well, and the quality factor of the resonator may be improved.

The thickness of the piezoelectric plate body 30 is 0.01 micron to 10 microns, and different thicknesses may be selected according to the specific set frequency. A material of the piezoelectric plate body 30 may be oxide, nitride or carbide, for example: aluminum nitride (AlN) and zinc oxide (ZnO), and may also be a piezoelectric crystal or piezoelectric ceramic, for example: a piezoelectric material with a wurtzite crystalline structure such as lead zirconate titanate (PZT), lithium niobate ($LiNbO_3$), quartz, potassium niobate ($KNbO_3$), lithium tantalate ($LiTaO_3$), lithium gallate, lithium germanate, titanium germanate or lead zinc sphene, etc., and combination thereof. When the piezoelectric plate body 102 includes aluminum nitride (AlN), the piezoelectric plate body 102 may further include rare earth metal, for example, at least one of scandium (Sc), erbium (Er), yttrium (Y) and lanthanum (La). In addition, when the piezoelectric plate body 102 includes the aluminum nitride (AlN), the piezoelectric plate body 102 may further include transition metal, for example, at least one of scandium (Sc), zirconium (Zr), titanium (Ti), manganese (Mn) and hafnium (HO).

Referring to FIG. 4, in this embodiment, a first dielectric layer 41 is arranged on the upper surface of the first base 50, the lower electrode 40 is embedded in the first dielectric layer 41, and the first gap 311 is exposed on the upper surface of the lower electrode 40; and an end part 302 of the lower electrode 40 and the isolation cavity 300 have an overlapping part. The part of the edge of the lower electrode is located inside or outside a region range surrounded by the isolation cavity in the direction perpendicular to the surface of the piezoelectric plate body. FIG. 4 shows that the end part 302 of the lower electrode 40, namely part of the boundary is completely located below the isolation cavity. Specifically, the first dielectric layer 41 wraps the lower electrode 40 for protecting the lower electrode 40. The end part 302 of the lower electrode 40 is located below the isolation cavity 300, that is, part of the boundary of the lower electrode 40 is cut off in the region surrounded by the isolation cavity 300. At this time, an effective working region outer side 303 (a region in a broken line in the figure) does not have an overlapping region with the upper electrode 20 in the vertical direction, thereby reducing parasitic effect. Moreover, when the acoustic wave is transmitted into the lower electrode 40 and the acoustic wave in the lower electrode 40 is transmitted to an end part of the lower electrode located below the isolation cavity 300, the air interface reflects the acoustic wave back into the lower electrode 40, thereby reducing the loss of the acoustic wave and improving the quality factor of the resonator.

Figure 5:
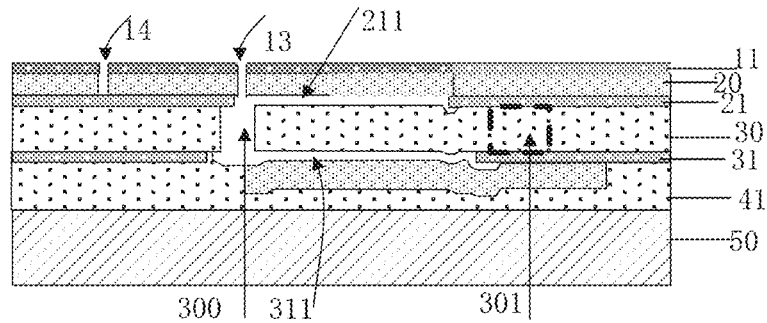
FIG. 5 shows a structural schematic diagram of a setting position of a through hole according to an embodiment of the present invention.

Continuously referring to FIG. 4, in this embodiment, at least one through hole 13 is formed in the upper electrode 20 above the second gap 211, a cap layer 110 is arranged on the upper surface of the upper electrode 20, and the through hole 13 is filled with the cap layer 110. The through hole 13 is a sacrificial hole for releasing the sacrificial layers filled in the first gap, the second gap and the isolation cavity. Referring to FIG. 5, in another embodiment, since the first gap, the second gap and the isolation cavity 300 communicate with each other, the through hole 13 may only penetrate through a structure above the isolation cavity 300.

In this embodiment, the cap layer 110 is a composite structure, and includes a fourth dielectric layer 11 and a top film layer 12 located on an upper surface of the fourth dielectric layer 11. The fourth dielectric layer 11 and the top film layer 12 are made of insulating materials. The material of the fourth dielectric layer 11 may be silicon dioxide or silicon nitride, and the material of the top film layer 12 may be an organic cured film. In this embodiment, the through hole 13 penetrates through the fourth dielectric layer 11 at the same time, and the fourth dielectric layer 11 is configured to protect the upper electrode 20 when the resonator is manufactured. The material of the top film layer 12 may be an organic cured film or a silicon dioxide layer. On one hand, the top film layer 12 is configured to seal the through hole 13; and on the other hand, the top film layer 12 may enhance the supporting function on the upper electrode 20.

A dielectric layer is arranged between the lower electrode 40 at an outer side of the first gap 311 and the piezoelectric plate body 30, or the lower electrode 40 at the outer side of the first gap 311 is in contact with the piezoelectric plate body 30; and/or a dielectric layer is arranged between the upper electrode 20 at an outer side of the second gap 211 and the piezoelectric plate body 30, or the upper electrode 20 is in contact with the piezoelectric plate body 30. Specifically, referring to FIG. 4, in this embodiment, a second dielectric layer 31 is arranged between the lower electrode 40 and the piezoelectric plate body 30, the first gap 311 is located in the second dielectric layer 31, and the second dielectric layer 31 defines a region range of the first gap 311. The second dielectric layer 31 is provided so as to make the piezoelectric plate body 30 exposed in the first gap 311 be flush with the lower surface of the piezoelectric plate body 30 not exposed in the first gap 311. The height of the second dielectric layer 31 determines the height of the first gap 311. Similarly, a third dielectric layer 21 is arranged between the upper electrode 20 and the piezoelectric plate body 30, the second gap 211 is located in the third dielectric layer 21, and the third dielectric layer 21 defines a region range of the second gap 211. The third dielectric layer 21 is provided so as to make the piezoelectric plate body 30 exposed in the second gap 211 be flush with the lower surface of the piezoelectric plate body 30 not exposed in the second gap 211. The height of the third dielectric layer 21 determines the height of the second gap 211. The materials of the first dielectric layer 41, the second dielectric layer 31 and the third dielectric layer 21 described above include silicon dioxide or silicon nitride.

The first base 10 may be a semiconductor substrate, or a semiconductor substrate or a dielectric layer thereon. The dielectric layer is a film layer formed on the semiconductor substrate when other device structures are formed on the semiconductor substrate. A material of the semiconductor substrate may be at least one of the following mentioned materials: silicon (Si), germanium (Ge), silicon-germanium (SiGe), silicon carbide (SiC), carbon silicon-germanium (SiGeC), indium arsenide (InAs), gallium arsenide (GaAs), indium phosphide (InP) or other III/V compound semiconductors, or may be silicon-on-insulator (SOI), superposed silicon-on-insulator (SSOI), superposed silicon-germanium-on-insulator (S—SiGeOI) and germanium-on-insulator (GeOI), or may also be double side polished wafers (DSP), or may also be a ceramic base, quartz or glass base of aluminum oxide, etc. A dielectric material on the semiconductor substrate includes: silicon oxide, silicon nitride, silicon carbide, silicon oxycarbide, silicon oxynitride, aluminum oxide, aluminum nitride or boron nitride.

In this embodiment, at the periphery of a region surrounded by the isolation cavity, the first gap and the second gap, the upper electrode and the lower electrode are staggered at a side where the part of the edge is located, and an opposite side of the part of the edge is provided with an opposite part. The resonator further includes: a first conductive plug 61, connected to the upper electrode 20 at the staggered side and penetrating through a structure above the upper electrode 20 on the other side, opposite to the base, of the upper electrode 20; and a second conductive plug 62, connected to the lower electrode 40 at the side with the opposite part and penetrating through the structure above the upper electrode 20 on the other side, opposite to the base, of the lower electrode 40.

In this embodiment, the first conductive plug 61 is located outside the effective working region, and there is no opposite part between the upper and lower electrodes at a side where the first conductive plug 61 is located, so parasitic effect between the upper and lower electrodes is avoided. Further, on one hand, the second conductive plug 62 plays a role in electrically connecting the lower electrode 40 with the outside, and on the other hand, the second conductive plug is also electrically connected with the upper electrode 20 at the side surface; therefore, the upper and lower electrodes outside the effective working region of the resonator are electrically connected, such that the upper and lower electrodes are short-circuited and there is no potential difference above and below the piezoelectric plate body 30, thereby reducing the parasitic effect of the overlapping region (the upper electrode, the piezoelectric plate body and the lower electrode) outside the effective resonance region, and improving the quality factor of the resonator. Based on the above description, in this embodiment, the whole resonator basically has not parasitic capacitance effect in all the noneffective regions, which is very helpful for improving the performance of the resonator.

Figure 6:
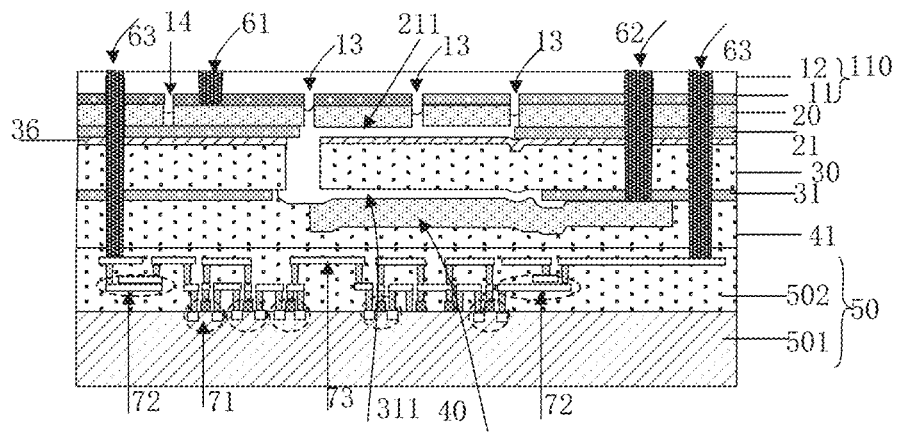
FIG. 6 shows a structural schematic diagram of a thin film piezoelectric acoustic wave resonator according to another embodiment of the present invention.

Referring to FIG. 6, in another embodiment of the present invention, the thin film piezoelectric acoustic wave resonator further includes an acoustic wave temperature compensation plate body 36, wherein the acoustic wave temperature compensation plate body 36 may be located on the upper or lower surface of the piezoelectric plate body 30, or located in the piezoelectric plate body 30; and the figure shows the situation where the acoustic wave temperature compensation plate body is located on the upper surface. The acoustic wave temperature compensation plate body 36 has a positive temperature coefficient and is made of a material such as boron-doped silicon dioxide. The placement of the acoustic wave temperature compensation plate body 36 reduces the electromechanical coupling coefficient of the resonator. The large the thickness is, the greater the influence on the electromechanical coupling efficient is. In this embodiment, the optional range of the thickness is 5 nm to 500 nm. The electromechanical coupling coefficient of the resonator is not reduced as much as possible while temperature compensation is realized. Moreover, continuously referring to FIG. 6, in this embodiment, the first base 50 includes a semiconductor substrate 51 and a dielectric layer 52 located on the semiconductor substrate, and a first active micro-device and/or a first passive micro-device are arranged in the first base 50. The first active micro-device includes one or a combination of a diode, a triode, an MOS transistor and an electrostatic discharge (ESD) protector. FIG. 6 shows an MOS transistor 72. Other devices are selected according to the actual requirements. The MOS transistor may form a radio frequency subsystem such as a radio frequency switch, a low noise amplifier and the like so as to realize short-distance interconnection with the filter, which may contribute to reducing signal insertion loss and interference caused by interconnection. The first passive micro-device includes a resistor, a capacitor or an electrical inductor, or a combination thereof. FIG. 6 shows an MIM capacitor 71 and an electrical inductor 73. Furthermore, the MOS transistor 72, the MIM capacitor 71 and the electrical inductor 73 in the figure are interconnected in a certain manner. In this way, short-distance interconnection with the filter is realized. The first passive micro-device may achieve more excellent in-situ impedance matching with the filter. In order to electrically connect the first active micro-device and/or the first passive micro-device 70 with the resonator, in this embodiment, the resonator further includes: a third conductive plug 63 located in a noneffective region, wherein one end of the third conductive plug is connected to the first active micro-device and/or the first passive micro-device, and the other end of the third conductive plug penetrates through a structure above the micro-device (referring to FIG. 6); the third conductive plug, the first conductive plug and the second conductive plug are connected through other interconnection structure on the cap layer so as to realize electrical connection of the micro-device and the upper and lower electrodes; however, it is not limited to this connection mode, the other end of the third conductive plug 63 may also be connected to the upper or lower electrode, and the first active micro-device and/or the first passive micro-device are electrically connected to the upper electrode 20 or the lower electrode 40 through the third conductive plug 63. In the figure, the first active micro-device and the first passive micro-device are indicated in a simplified form. It is necessary to set what kind of devices specifically needing to be included and the interconnection relationship between them according to the actual situation.

Figure 7:
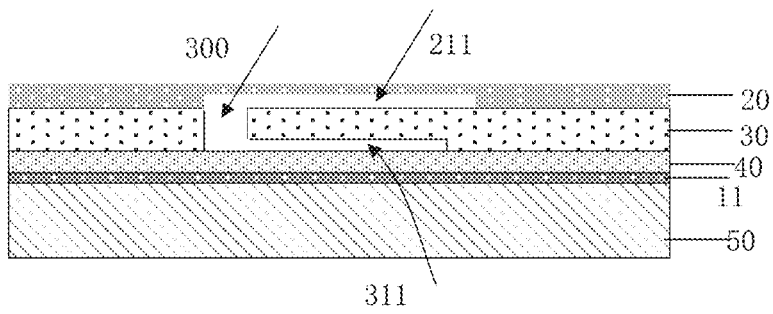
FIG. 7 shows a structural schematic diagram of a thin film piezoelectric acoustic wave resonator according to a second embodiment of the present invention.

Embodiment II, a second thin film piezoelectric acoustic wave resonator:

referring to FIG. 7, the main difference between this embodiment and the embodiment I is that: the piezoelectric plate body 30 is directly formed above the lower electrode 40 without a dielectric layer in the middle. At this time, the lower surface of the piezoelectric plate body 30 not exposed in the first gap 311 is in direct contact with the upper surface of the lower electrode 40, and the lower surface of the piezoelectric plate body 30 exposed in the first gap 311 is not flush with the lower surface of the piezoelectric plate body 30 not exposed in the first gap 311. At this time, the height of the first gap 311 is determined by the thickness of the sacrificial layer formed on the lower electrode 40. In the same way, a dielectric layer may not be arranged between the piezoelectric plate body 30 and the upper electrode 20, the upper electrode 20 above the second gap 211 is not flush with the bottom surface of the upper electrode 20 not exposed above the second gap 211, and the lower surface of the upper electrode 20 not exposed above the second gap 211 is in direct contact with the upper surface of the piezoelectric plate body 30. Refer to embodiment I for other parts not described.

Figure 8:
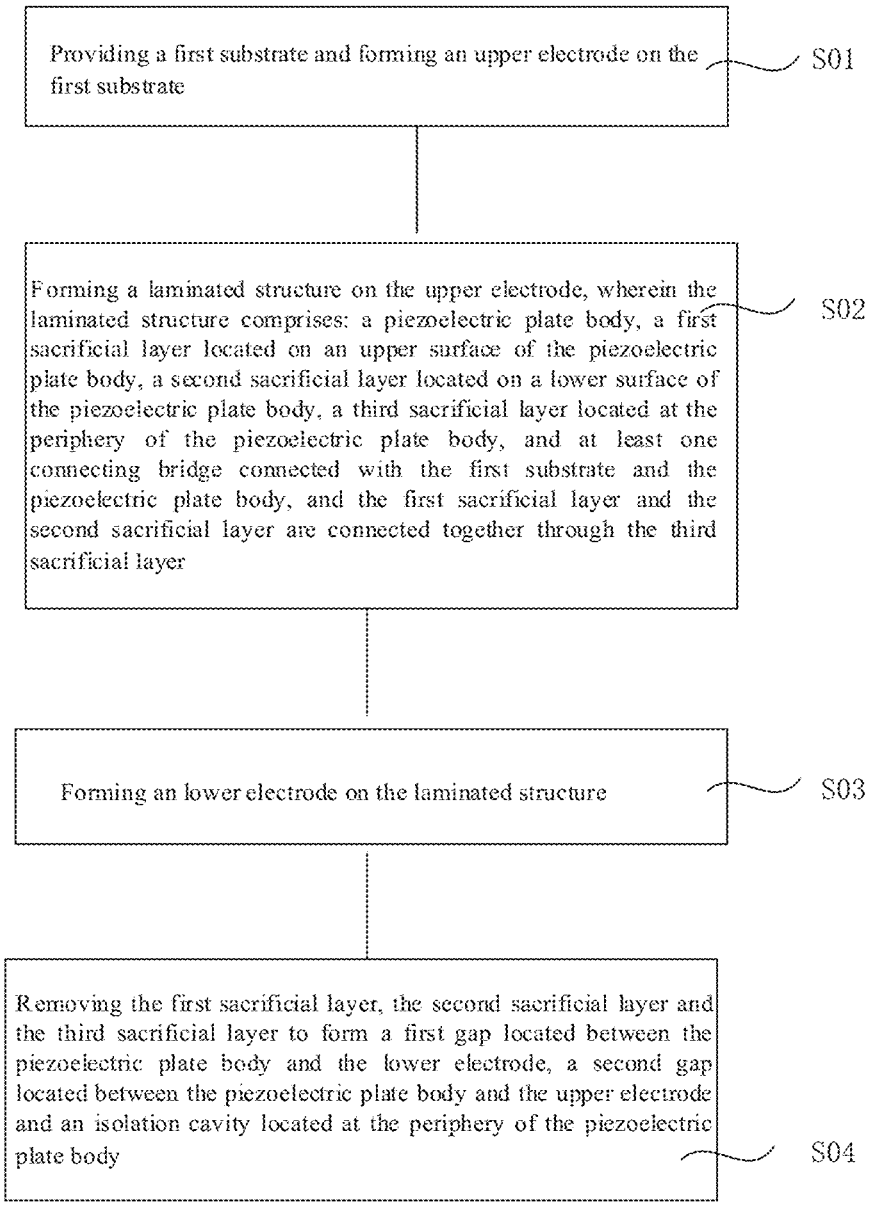
FIG. 8 shows a flowchart of a manufacturing method for a thin film piezoelectric acoustic wave resonator according to an embodiment of the present invention.

Embodiment III, a method for forming a first thin film piezoelectric acoustic wave resonator:

the third embodiment of the present invention provides a manufacturing method for a thin film piezoelectric acoustic wave resonator. FIG. 8 shows a flowchart of a manufacturing method for a thin film piezoelectric acoustic wave resonator according to an embodiment of the present invention. FIG. 9 to FIG. 25 show structural schematic diagrams of different stages of a manufacturing method for a thin film piezoelectric acoustic wave resonator according to an embodiment of the present invention. Referring to FIG. 8, the manufacturing method includes: S01: a first substrate is provided and an upper electrode is formed on the first substrate; S02: a laminated structure is formed on the upper electrode, wherein the laminated structure includes: a piezoelectric plate body, a first sacrificial layer located on an upper surface of the piezoelectric plate body, a second sacrificial layer located on a lower surface of the piezoelectric plate body, a third sacrificial layer located at the periphery of the piezoelectric plate body and at least one connecting bridge connected with the first substrate and the piezoelectric plate body, and the first sacrificial layer and the second sacrificial layer are connected together through the third sacrificial layer; S03: a lower electrode is formed on the laminated structure; and S04: the first sacrificial layer, the second sacrificial layer and the third sacrificial layer are removed to form a first gap located between the piezoelectric plate body and the lower electrode, a second gap located between the piezoelectric plate body and the upper electrode, and an isolation cavity located at the periphery of the piezoelectric plate body, wherein the upper electrode, the piezoelectric plate body and the lower electrode are provided with an overlapping region in a direction perpendicular to the surface of the first substrate, the first gap and the second gap are at least partially located in the overlapping region, and the overlapping region is defined as an effective working region.

The manufacturing method for the thin film piezoelectric acoustic wave resonator will be described below with reference to FIG. 9 to FIG. 25. FIG. 9 to FIG. 25 are structural schematic diagrams corresponding to each step in an embodiment of a manufacturing method for a thin film piezoelectric acoustic wave resonator in the present invention.

Figure 9:
FIG. 9 to FIG. 25 show structural schematic diagrams corresponding to different steps of a manufacturing method for a thin film piezoelectric acoustic wave resonator according to a first embodiment of the present invention.
Figure 10:
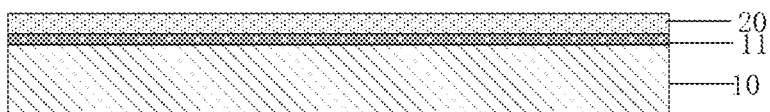

Referring to FIG. 9 and FIG. 10, the step S01 is performed, the first substrate 10 is provided, and the upper electrode 20 is formed on the first substrate 10. Referring to FIG. 9, in this embodiment, the upper electrode is the entire conductive layer, and the process for forming the upper electrode through patterning is completed in the subsequent process. Before the upper electrode 20 is formed, the method further includes: a fourth dielectric layer 11 is formed on the first substrate 10, the first substrate 10, as a temporary bearing layer, needs to be removed in the later process, and the fourth dielectric layer 11 plays an isolation role and is configured to isolate the first substrate 10 and the upper electrode 20. In another embodiment, the upper electrode is an electrode after the conductive layer is patterned, the upper electrodes between each adjacent resonators are mutually disconnected, and the noneffective region and the effective region of the upper electrode are mutually disconnected. The method for forming the upper electrode includes: an upper conductive thin film is formed on the first substrate; and the upper conductive thin film is patterned to form the upper electrode, wherein the end part of the upper electrode and the second sacrificial layer formed in the subsequent process have an overlapping part.

A material of the first substrate 10 may be one of the following mentioned materials: silicon (Si), germanium (Ge), silicon-germanium (SiGe), silicon carbide (SiC), carbon silicon-germanium (SiGeC), indium arsenide (InAs), gallium arsenide (GaAs), indium phosphide (InP) or other III/V compound semiconductors, or may be silicon-on-insulator (SOD, superposed silicon-on-insulator (SSOI), superposed silicon-germanium-on-insulator (S—SiGeOI) and germanium-on-insulator (GeOI), or may also be double side polished wafers (DSP), or may also be a ceramic base, quartz or glass base of aluminum oxide, etc. A material of the fourth dielectric layer 11 may include silicon dioxide or silicon nitride.

Referring to FIG. 10, the upper conductive thin film is formed above the surface of the fourth dielectric layer 11, and the upper conductive thin film may be formed by a physical vapor deposition or chemical vapor deposition method such as magnetron sputtering, evaporation and the like. In this embodiment, the upper conductive film layer is not patterned to form the upper electrode after the upper conductive film layer is formed, and the patterning process of the upper conductive film layer is completed later. In other embodiments, after the upper conductive film layer is formed, the upper conductive film layer is directly patterned to form the upper electrode 20. The upper electrode 20 may be made of one or alloy of molybdenum (Mo), aluminum (Al), copper (Cu), tungsten (W), tantalum (Ta), platinum (Pt), ruthenium (Ru), rhodium (Rh), iridium (Ir), chromium (Cr), titanium (Ti), gold (Au), osmium (Os), rhenium (Re), palladium (Pd), platinum, nickel and the like.

Referring to FIG. 11 to FIG. 17, the step S02 is performed, and the laminated structure is formed on the upper electrode 20. The laminated structure includes: a piezoelectric plate body 30, a first sacrificial layer 23 located on an upper surface of the piezoelectric plate body 30, a first sacrificial layer 35 located on a lower surface of the piezoelectric plate body 30, a third sacrificial layer 34 located at the periphery of the piezoelectric plate body 30, and at least one connecting bridge 301 connected with the first substrate 10 and the piezoelectric plate body 30.

In this embodiment, the step of forming the laminated structure includes the following steps:

S21: the second sacrificial layer 23 and the third dielectric layer 21 are formed on the upper electrode 20, and the third dielectric layer 21 defines the range of the second sacrificial layer 23; S22: the piezoelectric plate body 30, the third sacrificial layer 34 of the piezoelectric plate body 30 at least partially surrounding the overlapping region, and at least one connecting bridge 301 connected with the first substrate 10 and the piezoelectric plate body 30 are formed on the second sacrificial layer 23 and the third dielectric medium 21; and S23: the first sacrificial layer 35 and the second dielectric layer 31 are formed on the piezoelectric plate body 30, and the second dielectric layer 31 defines the range of the first sacrificial layer 35.

Figure 11:
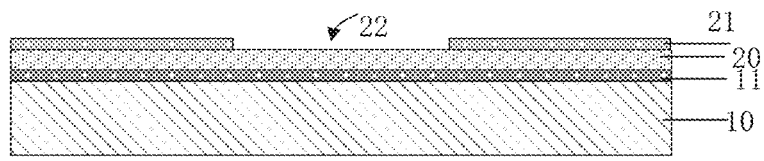
Figure 12:
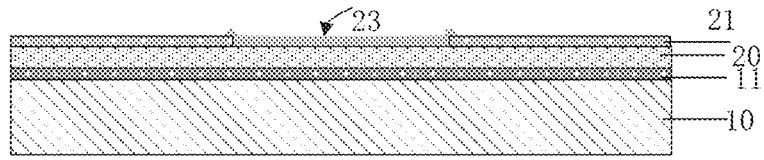

Specifically, the step S21 includes: 1. Referring to FIG. 11, a third dielectric thin film is formed on the surface of the upper electrode 20, and the third dielectric thin film is patterned to form a second groove 22 penetrating through the third dielectric thin film, wherein the third dielectric thin film outside the second groove 22 is the third dielectric layer 21. 2. Referring to FIG. 12, a second sacrificial thin film is formed to cover the second groove 22 and the third dielectric layer 21.3. The second sacrificial thin film is patterned to remove the second sacrificial thin film above the third dielectric layer 21 and make the upper surface of the second sacrificial thin film in the second groove be flush with the upper surface of the third dielectric layer 21. The second sacrificial thin film in the second groove forms the second sacrificial layer 23. Specifically, the third dielectric thin film is formed on the surface of the upper electrode 20 through physical vapor deposition or chemical vapor deposition. The third dielectric thin film is patterned by an etching process to form the second groove 22 penetrating through the third dielectric thin film. The third dielectric thin film outside the second groove 22 forms the third dielectric 21. A region where the second groove 22 is located is a formation region of the second gap in the later process. The second sacrificial thin film is formed in the second groove 22 and on the third dielectric layer 21 through a vapor deposition process (including evaporation, sputtering and chemical vapor deposition) or a liquid deposition process (including electroplating), and the second sacrificial thin film above the third dielectric layer 21 is removed by the etching process. The second sacrificial thin film in the second groove 22 forms the second sacrificial layer 23. In this embodiment, the method for making the upper surface of the second sacrificial thin film be flush with the upper surface of the third dielectric layer 21 includes: the surface of the second sacrificial thin film in the second groove 22 is subjected to ion beam trimming by an ion beam trimming process, so that a ratio of a height of a micro protrusion or depression at the upper surface of the second sacrificial layer 23 to a thickness of the second sacrificial layer 23 is less than 0.1%. In the later process, it is necessary to form the piezoelectric plate body on the upper surface of the second sacrificial layer 23, the flatness of the upper and lower surfaces of the piezoelectric plate body affects the overall performance of the resonator, and the flatness of the surface of the second sacrificial layer 23 affects the flatness of the lower surface of the piezoelectric plate body. Therefore, the upper surface of the second sacrificial layer 23 is subjected to ion beam trimming, such that the performance of the resonator may be improved.

It should be noted that the second sacrificial thin film above the third dielectric layer 21 is removed through etching and photoresist needs to serve as a mask. After the etching process is completed, it is necessary to remove the photoresist. In the process of removing the photoresist, the photoresist is removed by a wet process, for example, the photoresist is removed by a mixed solution of sulfuric acid and hydrogen peroxide. The second sacrificial layer 23 may be removed at the same time when the photoresist is removed by a dry process.

Figure 13:
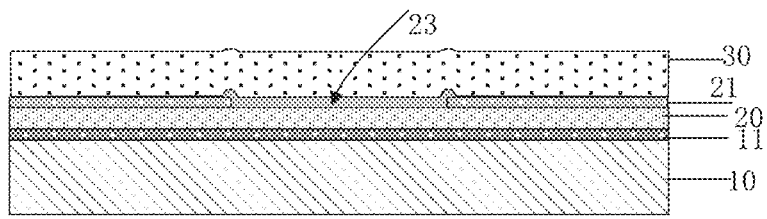
Figure 14:
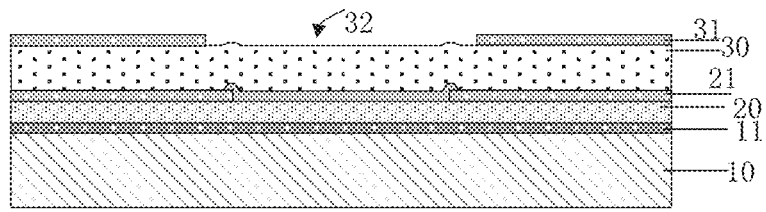
Figure 15:
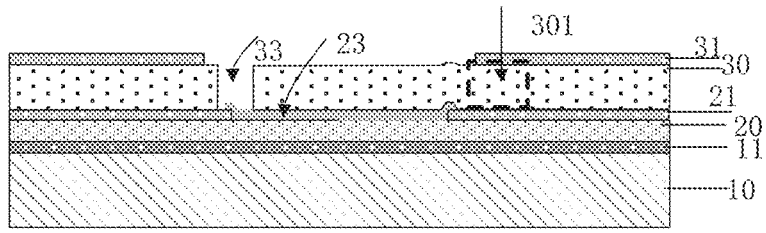
Figure 16:
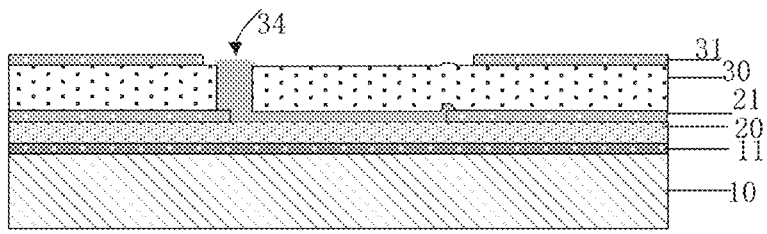

The step S22 includes: 1. Referring to FIG. 13, a piezoelectric induction thin film is formed on the second sacrificial layer 23 and the third dielectric layer 21. 2. Referring to FIG. 14, a second dielectric thin film is formed on the piezoelectric induction thin film, and the second dielectric thin film is patterned to form a first groove 32 penetrating through the second dielectric thin film, wherein the patterned second dielectric thin film is the second dielectric layer 31. 3. Referring to FIG. 15, the piezoelectric induction thin film in the first groove 32 is patterned to form a trench 33 which disconnects the piezoelectric induction thin film, the bottom of the trench 33 exposes part of the second sacrificial layer 23, a part, not disconnected by the trench 33, of the piezoelectric induction thin film forms the connecting bridge 301, the trench 33 cuts the piezoelectric induction thin film to form a piezoelectric plate body 30, part of the end part of the piezoelectric plate body 30 is exposed in the trench 33, the trench 33 is configured to form an isolation cavity in the later process, and the shape and position of the trench 33 and the piezoelectric plate body 30 are referenced to a relationship between the isolation cavity and the piezoelectric plate body in the first embodiment, which is not elaborated here. 4. Referring to FIG. 16, a third sacrificial thin film is formed to cover the trench 33 and the piezoelectric induction plate body 30. 5. The third sacrificial thin film at the periphery of the trench is removed, and the upper surface of the third sacrificial thin film in the trench is flush with the upper surface of the piezoelectric plate body 30, wherein the third sacrificial thin film in the trench forms the third sacrificial layer 34.

Specifically, a piezoelectric induction thin film 30 with a thickness of 0.01 micron to 10 microns is formed on the second sacrificial layer 23 and the third dielectric layer 21 through physical vapor deposition or chemical vapor deposition, and a material of the piezoelectric induction thin film refers to the above. In this embodiment, after the piezoelectric induction thin film is formed, the method further includes: the upper surface of the piezoelectric induction thin film is subjected to flatness trimming through an ion beam trimming process, such that a ratio of the height of the micro protrusion or depression of the upper surface of the piezoelectric induction thin film to the thickness of the piezoelectric induction thin film is less than 0.1%. The flatness of the upper and lower surfaces of the piezoelectric plate body affect the overall performance of the resonator, and the performance of the resonator may be improved by performing ion beam trimming on the upper surface of the piezoelectric plate body 30. The second dielectric thin film is formed on the piezoelectric induction thin film 30 through physical or chemical vapor deposition; the first groove 32 penetrating through the second dielectric thin film is formed in the second dielectric thin film through the etching process; and the region where the first groove 32 is located is a region wherein the first gap is located in the later process. The piezoelectric induction thin film 30 in the first groove 32 is patterned to form the trench 33 for disconnecting the piezoelectric induction thin film, and the bottom of the trench 33 exposes part of the second sacrificial layer 23. The bottom of the trench 33 exposes part of the second sacrificial layer 23, such that the first gap formed in the later process communicates with the isolation cavity. When the trench 33 is an unsealed trench, a part, not disconnected by the trench 33, of the piezoelectric induction thin film forms the connecting bridge 301. The shape and position actions of the connecting bridge 301 are referenced to the above.

Referring to FIG. 16, the third sacrificial thin film is formed in the trench, on the upper surface of the piezoelectric plate body 30 and on the upper surface of the second dielectric layer 31 through a deposition process. The third sacrificial thin film at the periphery of the trench is removed by the etching process, the third sacrificial thin film in the trench is remained to serve as a third sacrificial layer, and the upper surface of the third sacrificial layer 34 in the trench is flush with the upper surface of the piezoelectric plate body 30; and the third sacrificial thin film in the trench forms the third sacrificial layer 34.

Figure 17:
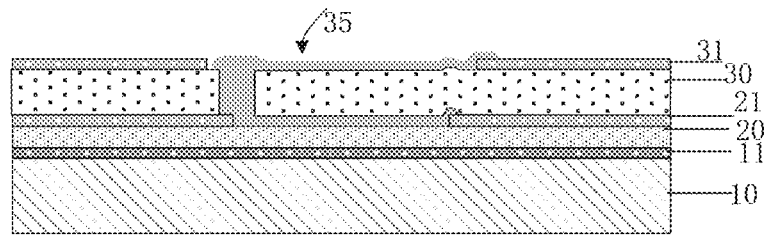

Referring to FIG. 17, the first sacrificial thin film is formed on the third sacrificial layer, the first groove and the upper surface of the second dielectric layer 31, and the method for forming the first sacrificial thin film is referenced to the method for forming the second sacrificial thin film. The first sacrificial thin film outside the first groove is removed by the etching process to make the upper surface of the first sacrificial thin film be flush with the upper surface of the second dielectric layer 31; and the first sacrificial thin film in the first groove forms the first sacrificial layer 35. In this embodiment, the method for making the upper surface of the first sacrificial thin film be flush with the upper surface of the second dielectric layer 31 includes: the surface of the first sacrificial layer 31 in the first groove is subjected to flatness trimming by the ion beam trimming process, such that a ratio of the height of the micro protrusion or depression at the upper surface of the first sacrificial layer to the thickness of the first sacrificial layer is less than 0.1%. Since the material of the first sacrificial layer 35 is softer than the material of the second dielectric layer 31 at the periphery, if a CPM process is adopted, it is liable to lead to that the middle of the first sacrificial layer 35 is recessed downwards, and the ion beam trimming process may prevent the first sacrificial layer 35 from being recessed downwards and may control the thickness of the sacrificial layer better. In this embodiment, materials of the first sacrificial layer, the second sacrificial layer and the third sacrificial layer include any one of phosphorosilicate glass, boron phosphorosilicate glass, germanium, carbon, low-temperature silicon dioxide and polyimide.

Figure 18:
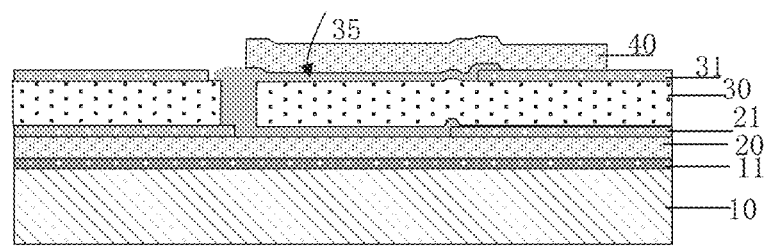

Referring to FIG. 18, a lower electrode 40 is formed on the laminated structure. A lower conductive thin film is formed on the first sacrificial layer 35 and the second dielectric layer 31 through a magnetron sputtering process, and the lower conductive thin film is patterned to form the lower electrode 40. In this embodiment, part of the end part of the lower electrode 40 is cut off above the third sacrificial layer. The effect of the setting mode is referenced to the above. Specifically, a pattern of the lower electrode 40 may be set according to the actual requirement. For example, various situations described in the above first embodiment are not limited to that part of the boundary shown in FIG. 18 is cut off above the third sacrificial layer.

Figure 19:
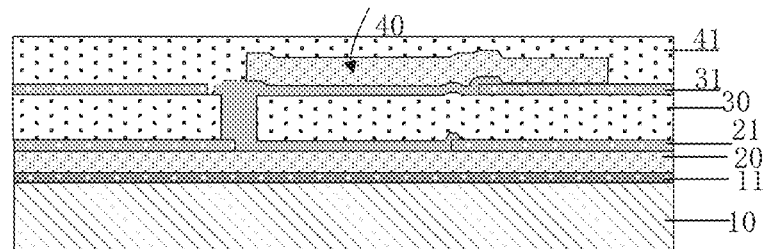
Figure 20:
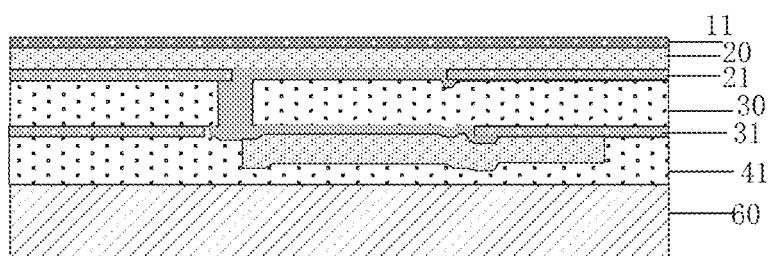
Figure 21:
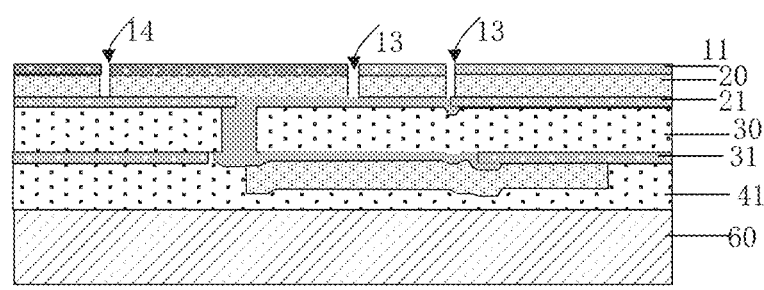

Referring to FIG. 19 to FIG. 21, in this embodiment, after the lower electrode 40 is formed, the method further includes: a first dielectric layer 41 is formed to cover the lower electrode 40; a second substrate 60 is bonded on the first dielectric layer 41 and then the first substrate 10 is removed; the entire conductive layer is patterned to form the upper electrode 20, the upper electrodes 20 between each adjacent resonators are mutually disconnected, and the non-effective region and the effective region of the upper electrode 20 are mutually disconnected. Referring to FIG. 21, when the upper electrode 20 is formed through patterning, a through hole of a sacrificial hole is formed through etching, and an isolation groove 14 is formed between two resonators. Specifically, the first dielectric 41 is formed above the surface of the lower electrode 40 through a deposition process, and the top surface of the first dielectric layer 41 is flush through a planarization process.

Figure 22:
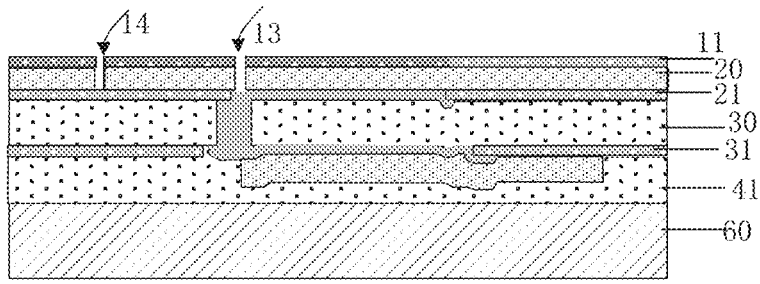
Figure 23:
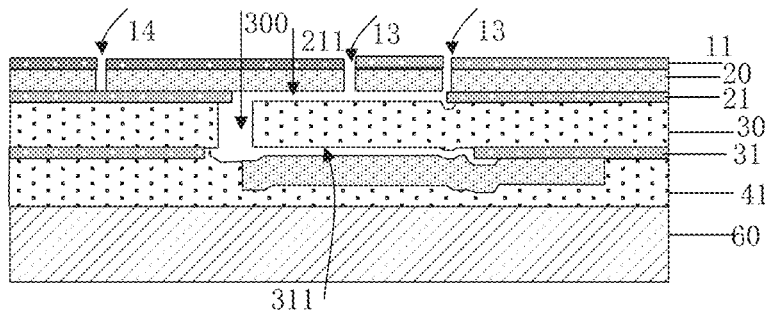

Referring to FIG. 20 to FIG. 23, the first sacrificial layer, the second sacrificial layer and the third sacrificial layer are removed to form a first gap 311 between the piezoelectric plate body 30 and the lower electrode 40, a second gap 211 located between the piezoelectric plate body 30 and the upper electrode 20, and an isolation cavity located at the periphery of the piezoelectric plate body 30. In this embodiment, removing the sacrificial layer specifically includes the following steps: referring to FIG. 20, a second substrate 60 is bonded on the upper surface of the first dielectric layer 41, and the first substrate 10 is removed. Referring to FIG. 21 to FIG. 23, at least one through hole 13 penetrating through a film layer above the second sacrificial layer and/or the third sacrificial layer is formed, the first sacrificial layer, the second sacrificial layer and the third sacrificial layer are converted into volatile gas through gas-phase chemical reaction to be discharge from the through hole, or the first sacrificial layer or the second sacrificial layer is dissolved through liquid chemical reaction to be discharged from the through hole. Referring to FIG. 21, the through hole 13 penetrates through a structure above the second sacrificial layer. Referring to FIG. 22, the through hole penetrates through a structure above the third sacrificial layer. In this embodiment, a fourth dielectric layer 11 is arranged on the surface of the upper electrode 20 with the through hole 13, and the through hole 13 penetrates through the fourth dielectric layer 11 at the same time. After three sacrificial layers are removed, the piezoelectric plate body 30 is suspended between the first gap 311 and the second gap 211, and the part of the edge of the piezoelectric plate body 30 is exposed in the isolation cavity 300.

It should be note that when the through hole 13 is formed, an isolation groove 14 is formed between the two resonators, thereby realizing electrical isolation between the adjacent two resonators.

Figure 24:
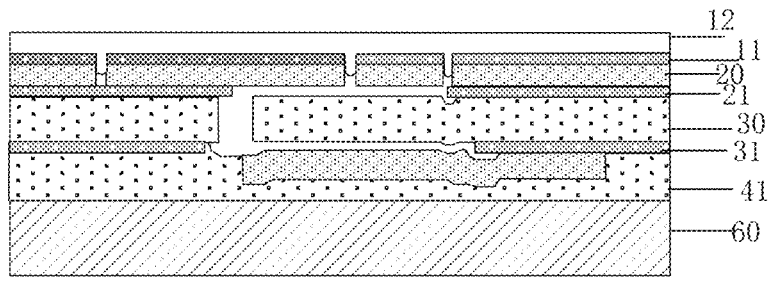

Referring to FIG. 24, a top film layer 12 is formed on the fourth dielectric layer 11, the top film layer 12 seals the through hole, and the material and effect of the top film layer 12 are referenced to the above. In this embodiment, the fourth dielectric layer 11 and the top film layer 12 jointly form the cap layer. It will not be elaborated herein.

Figure 25:
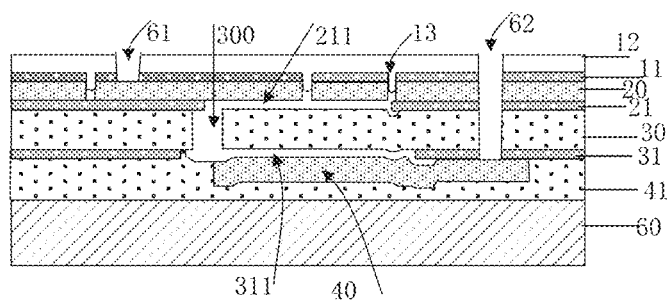

Referring to FIG. 25, in this embodiment at the periphery of a region surrounded by the isolation cavity 300, the first gap 311 and the second gap 211, the upper electrode 20 and the lower electrode 40 are staggered at the side where the part of the edge is located, and an opposite side of the part of the edge is provided with an opposite part. The method further includes: a first conductive plug 61 is formed, the upper electrode 20 is connected at the staggered side, and a structure above the upper electrode 20 is penetrated at the other side, opposite to the first substrate, of the upper electrode 20; and a second conductive plug 62 is formed, the side with the opposite part is connected to the lower electrode 40, and the structure above the upper electrode 20 is penetrated at the other side, opposite to the first substrate, of the lower electrode 40. In this embodiment, the structure above the upper electrode 20 includes a top film layer 12 and a fourth dielectric layer 11. The first conductive plug 61 penetrates through the top film layer 12 and the fourth dielectric layer 11, and the first conductive plug 61 is electrically connected to the upper electrode 20. A structure above the lower electrode 40 includes: the top film layer 12 and the fourth dielectric layer 11, the upper electrode 20, the third dielectric layer 21, the piezoelectric plate body 30 and the second dielectric layer 31, the second conductive plug 62 penetrates through the top film layer 12 and the fourth dielectric layer 11, the upper electrode 20, the third dielectric layer 21, the piezoelectric plate body 30 and the second dielectric layer 31, and the second conductive plug 62 is connected to the lower electrode 40. The first conductive plug 61 and the second conductive plug 62 are located outside the effective working region of the resonator. The second conductive plug 62 electrically connects the upper electrode with the lower electrode of the noneffective working region, wherein the upper electrode 20 electrically connected to the second conductive plug 62 is separated from the upper electrode in the effective working region. The second conductive plug 62 enables the piezoelectric plate body in the noneffective working region not to generate voltage difference up and down, thereby reducing parasitic effect.

Referring to FIG. 6, in another embodiment, the second substrate is a first base 50, and a first active micro-device and/or a first passive micro-device is formed in the second substrate, wherein the first active micro-device includes a diode, an MOS transistor and a simple semiconductor electrostatic discharge protection device, and the first passive micro-device includes a resistor, a capacitor or an electrical inductor. The method further includes: a third conductive plug 63 is formed, and the first active micro-device and/or the first passive micro-device are electrically connected to the upper electrode 20 or the lower electrode 40 through the third conductive plug 63. Different first active micro-device and/or first passive micro-device may be integrated according to the design requirement. The first active micro-device and/or the first passive micro-device are integrated in the second substrate, such that the integration degree of the device can be increased, and the insertion loss and the anti-interference performance can be improved while the volume of the whole integrated radio frequency microsystem can be shortened.

According to the method for forming the third conductive plug 63 illustrated in FIG. 6, the third conductive plug 63 may be formed after the first conductive plug and the second conductive plug are formed, or the third conductive plug 63 may be formed before the first conductive plug and the second conductive plug are formed. This embodiment performs description by taking the case where the upper electrode 20 is formed on the first substrate and is not patterned as an example. In the present invention, the upper electrode 20 may be an electrode which is patterned and formed on the first substrate. At this time, the cap layer and the through hole released as a sacrificial layer are not formed on the upper electrode 20, but should be formed on the lower electrode 40.

Therefore, in the present invention, the method for removing the first sacrificial layer, the second sacrificial layer and the third sacrificial layer includes: at least one through hole penetrating through a film layer above the sacrificial layer far away from the remained substrate is formed, for example, in the first embodiment, the sacrificial layer is the first sacrificial layer. The upper electrode on the first substrate is not patterned, and at this time, it is necessary to remove the first substrate and remain the second substrate; and when the upper electrode on the first substrate is patterned, the remained substrate is the first substrate and the second substrate is not required. In the absence of the second substrate, the sacrificial layer is the second sacrificial layer. The cap layer is formed on the surface of the electrode where the through hole is formed, and the cap layer fills the through hole. When the remained substrate is the first substrate, the through hole is formed in the lower electrode, and the cap layer is formed on the lower electrode.

Figure 26:
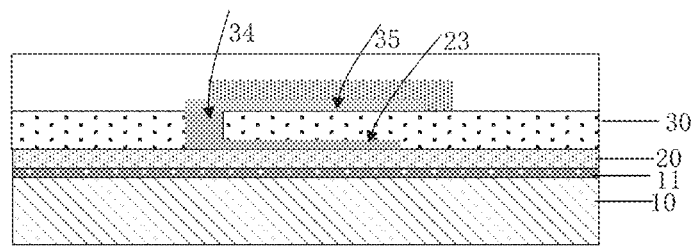
FIG. 26 shows a structural schematic diagram in the manufacturing process of a thin film piezoelectric acoustic wave resonator according to a second embodiment of the present invention.

Referring to FIG. 26, in another embodiment, the step that dielectric layers are not arranged on the upper and lower surfaces of the piezoelectric plate body and a laminated structure is formed includes: a second sacrificial layer 23 is formed on the upper electrode 20; a piezoelectric induction thin film is formed to cover the upper electrode 20, the second sacrificial layer 23 and the first substrate 10; the piezoelectric induction thin film is patterned to form a trench which disconnects the piezoelectric induction thin film, the bottom of the trench exposes part of the second sacrificial layer 23, and a part, not disconnected by the trench, of the piezoelectric induction thin film forms a connecting bridge; a third sacrificial layer 34 is formed in the trench, and the upper surface of the third sacrificial layer 34 is flush with the upper surface of the piezoelectric plate body 30; a first sacrificial thin film is formed to cover the third sacrificial layer 34 and the piezoelectric plate body 30; and the first sacrificial thin film is patterned, the first sacrificial thin film outside a second region is removed, the second region is located in the effective working region, and the first sacrificial thin film at the second region forms the first sacrificial layer 35.

Specifically, the second sacrificial thin film is formed on the upper electrode 20, the second sacrificial thin film covers the upper electrode 20, the second sacrificial thin film is patterned to form the second sacrificial layer 23, the second sacrificial layer 23 is located in the effective working region, and the position of the second sacrificial layer 23 is configured to form the second gap. The thickness of the second sacrificial layer is the height of the second gap, and the optional range is 0.1 nm to 5 nm. A material of the second sacrificial layer 23 is referenced to the above. A piezoelectric induction thin film is formed on the second sacrificial layer 23 and the upper electrode 20 through the deposition process, the thickness of the piezoelectric induction thin film is between 0.1 micron and 10 microns, and a material of the piezoelectric induction thin film is referenced to the above. The trench which disconnects the piezoelectric induction thin film is formed in the piezoelectric induction thin film through the etching process. The trench defines the boundary of the edge of the piezoelectric plate body 30. In this embodiment, the bottom of the trench exposes part of the second sacrificial layer 23, and a part, not disconnected by the trench, of the piezoelectric induction thin film forms a connecting bridge. The shape and distribution of the trench, the shape of the piezoelectric plate body 30, and the position of the connecting bridge are as same as those of the above embodiment, which is not elaborated herein. The third sacrificial thin film is formed to cover the trench and the upper surface of the piezoelectric plate body 30, and the third sacrificial thin film outside the trench is removed to form the third sacrificial layer 34. The first sacrificial thin film is formed to cover the third sacrificial layer 34 and the upper surface of the piezoelectric plate body 30, the first sacrificial thin film is patterned, the first sacrificial thin film outside the second region is removed, the second region is located in the effective working region, the second region is a region where the first gap is located, and the first sacrificial thin film at the second region forms the first sacrificial layer 35. The material and thickness of the first sacrificial thin film are referenced to the material and thickness of the third sacrificial thin film.

Other information about the removal of the sacrificial layer and the formation of the cap layer is referenced to the relevant description in the method i the above embodiment.

It should be noted that each embodiment in the specification is described by a relevant mode, the same or similar part between each embodiment may refer to each other, and each embodiment focuses on the difference from other embodiments. In particular, for the structural embodiment which is basically similar to the method embodiment, the description is relatively simple, and the relevant points are referenced to the partial description of the method embodiment.

The above description is only the description of the preferred embodiment of the present invention and does not constitute any limitation to the scope of the present invention. Any changes and modifications made by those of ordinary skill in the field of the present invention according to the content disclosed above shall fall within the protection scope of the claims.

What is claimed is:

1. A thin film piezoelectric acoustic wave resonator, comprising:
    a first base;
    an upper electrode, a piezoelectric plate body and a lower electrode, arranged on an upper surface of the first base and stacked sequentially from top to bottom,
    wherein the upper electrode, the piezoelectric plate body and the lower electrode are provided with an overlapping region in a direction perpendicular to the surface of the piezoelectric plate body, and
    in the overlapping region, a first gap is formed between the piezoelectric plate body and the upper electrode, and a second gap is formed between the piezoelectric plate body and the lower electrode; and
    an isolation cavity, surrounding the periphery of the piezoelectric plate body, wherein at least one connecting bridge is arranged between the piezoelectric plate body and the base, and
    the first gap communicates with the second gap through the isolation cavity.

2. The thin film piezoelectric acoustic wave resonator according to claim 1, further comprising an acoustic wave temperature compensation plate body, wherein the acoustic wave temperature compensation plate body is located on the upper and lower surfaces of the piezoelectric plate body, or located in the piezoelectric plate body.

3. The thin film piezoelectric acoustic wave resonator according to claim 1, wherein a part of the edge of the lower electrode is located inside or outside a region range surrounded by the isolation cavity in the direction perpendicular to the surface of the piezoelectric plate body.

4. The thin film piezoelectric acoustic wave resonator according to claim 1, wherein the piezoelectric plate body is a polygon and any two sides of the polygon are not parallel; and at least part of the boundary of the piezoelectric plate body is formed by the isolation cavity.

5. The thin film piezoelectric acoustic wave resonator according to claim 1, wherein the shape of an edge of the piezoelectric plate body exposed by the isolation cavity comprises one or more arcs and/or straight sides; a part of the piezoelectric plate not cut by the isolation cavity forms the connecting bridge.

6. The thin film piezoelectric acoustic wave resonator according to claim 1, wherein a height of the first gap or the second gap is 0.1 nm to 5 microns; and/or
    a thickness of the piezoelectric plate body is 0.01 micron to 10 microns.

7. The thin film piezoelectric acoustic wave resonator according to claim 1, further comprising at least one through hole, wherein the through hole is formed above the first gap or above the isolation cavity;
    a cap layer is arranged on an upper surface of the upper electrode, and the cap layer fills the through hole;
    a material of the cap layer comprises one or a combination of two of silicon dioxide, silicon nitride and an organic cured film.

8. The thin film piezoelectric acoustic wave resonator according to claim 1, wherein a dielectric layer is arranged between the lower electrode at an outer side of the second gap and the piezoelectric plate body, or the lower electrode at an outer side of the second gap is in contact with the piezoelectric plate body;
    and/or a dielectric layer is arranged between the upper electrode at an outer side of the first gap and the piezoelectric plate body, or the upper electrode is in contact with the piezoelectric plate body.

9. The thin film piezoelectric acoustic wave resonator according to claim 1, further comprising:
    a first dielectric layer, wherein the lower electrode is embedded in the first dielectric layer and the second gap exposes an upper surface of the lower electrode;
    a second dielectric layer, wherein the second dielectric layer defines a region range of the second gap; and the second dielectric layer is located between the piezoelectric plate body at an outer side of the second gap and the lower electrode;
    a third dielectric layer, wherein the third dielectric layer defines a region range of the first gap; and the third dielectric layer is located between the piezoelectric plate body at an outer side of the second gap and the upper electrode.

10. The thin film piezoelectric acoustic wave resonator according to claim 2, at the periphery of a region surrounded by the isolation cavity, the first gap and the second gap, the upper electrode and the lower electrode being staggered at a side where the part of the edge is located, an opposite side of the part of the edge being provided with an opposite part, and
    the resonator further comprising:
    a first conductive plug, connected to the upper electrode at the staggered side and penetrating through a structure above the upper electrode on the other side, opposite to the base, of the upper electrode; and
    a second conductive plug, connected to the lower electrode at the side with the opposite part and penetrating through the structure above the upper electrode on the other side, opposite to the base, of the lower electrode.

11. The thin film piezoelectric acoustic wave resonator according to claim 1, a first active micro-device and/or a first passive micro-device being embedded in the first base, and the resonator further comprising:
    a third conductive plug, located in a non-effective region, wherein one end of the third conductive plug is connected to the first active micro-device and/or the first passive micro-device, and the other end of the third conductive plug penetrates through a structure above the micro-device; or the other end of the third conductive plug is connected to the upper electrode or the lower electrode;

the first active micro-device comprises a diode, a triode, an MOS transistor or an electrostatic discharge protection device; and/or the first passive micro-device comprises a resistor, a capacitor or an electrical inductor.

12. A filter, comprising a plurality of resonators according to claim 1.

13. A manufacturing method for a thin film piezoelectric acoustic wave resonator, comprising:
providing a first substrate;
forming an upper electrode on the first substrate;
forming a laminated structure on the upper electrode, wherein the laminated structure comprises: a piezoelectric plate body, a first sacrificial layer located on an upper surface of the piezoelectric plate body, a second sacrificial layer located on a lower surface of the piezoelectric plate body, a third sacrificial layer located at the periphery of the piezoelectric plate body, and at least one connecting bridge connected with the first substrate and the piezoelectric plate body, and the first sacrificial layer and the second sacrificial layer are connected together through the third sacrificial layer;
forming a lower electrode on the laminated structure; and
removing the first sacrificial layer, the second sacrificial layer and the third sacrificial layer to form a first gap located between the piezoelectric plate body and the lower electrode, a second gap located between the piezoelectric plate body and the upper electrode and an isolation cavity located at the periphery of the piezoelectric plate body;
the upper electrode, the piezoelectric plate body and the lower electrode is provided with an overlapping region in a direction perpendicular to a surface of the first substrate, the first gap and the second gap are at least partially located in the overlapping region, and the overlapping region is defined as an effective working region.

14. The manufacturing method for the thin film piezoelectric acoustic wave resonator according to claim 13, wherein the step of forming the laminated structure comprises:
forming a second sacrificial layer and the third dielectric layer on the upper electrode, the third dielectric layer defining the range of the second sacrificial layer;
forming the piezoelectric plate body, the third sacrificial layer of the piezoelectric plate body at least partially surrounding the overlapping region, and at least one connecting bridge connected with the first substrate and the piezoelectric plate body on the second sacrificial layer and the third dielectric layer; and
forming the first sacrificial layer and the second dielectric layer on the piezoelectric plate body, the second dielectric layer defining the range of the first sacrificial layer;
the step of forming the second sacrificial layer and the third dielectric layer comprises:
forming a third dielectric thin film on a surface of the upper electrode and patterning the third dielectric thin film to form a second groove penetrating through the third dielectric film;
forming a second sacrificial thin film to cover the second groove and the third dielectric thin film; and
removing the second sacrificial thin film above the third dielectric thin film and making an upper surface of the second sacrificial thin film in the second groove be flush with an upper surface of the third dielectric layer, the second sacrificial thin film in the second groove forming the second sacrificial layer, and the third dielectric thin film outside the second sacrificial layer being the third dielectric layer.

15. The manufacturing method for the thin film piezoelectric acoustic wave resonator according to claim 14, wherein the step of forming the piezoelectric plate, the third sacrificial layer at least partially surrounding the piezoelectric plate body, the at least one connecting bridge connected with eh first substrate and the piezoelectric plate body, the first sacrificial layer and the second dielectric layer comprises:
forming a piezoelectric induction thin film on the second sacrificial layer and the third dielectric layer;
forming a second dielectric thin film on the piezoelectric induction thin film;
patterning the second dielectric thin film to form a first groove penetrating through the second dielectric thin film;
patterning the piezoelectric induction thin film in the first groove to form a trench for disconnecting the piezoelectric induction thin film, the bottom of the trench exposing part of the first sacrificial layer, and a part of the piezoelectric induction thin film not disconnected by the trench forming the connecting bridge;
forming a third sacrificial thin film to cover the trench and the piezoelectric induction thin film;
removing the third sacrificial thin film at the periphery of the trench and making an upper surface of the third sacrificial thin film in the trench be flush with an upper surface of the piezoelectric plate body;
the third sacrificial thin film in the trench forming the third sacrificial layer, and the piezoelectric induction thin film at the periphery of the third sacrificial layer forming the piezoelectric plate body;
forming the first sacrificial thin film to cover the third sacrificial layer, the first groove and the second dielectric layer; and
removing the first sacrificial thin film outside the first groove and making an upper surface of the first sacrificial thin film be flush with an upper surface of the second dielectric layer,
the first sacrificial thin film in the first groove being the first sacrificial layer.

16. The manufacturing method for the thin film piezoelectric acoustic wave resonator according to claim 15, wherein the step of making the upper surface of the first sacrificial thin film in the first groove be flush with the upper surface of the second dielectric layer comprises:
performing flatness trimming on the upper surface of the first sacrificial layer by an ion beam trimming process, such that a ratio of a height of a micro protrusion or depression at the upper surface of the first sacrificial layer to a thickness of the first sacrificial layer is less than 0.1%; and/or
after the step of forming the piezoelectric induction thin film, the manufacturing method further comprising:
performing flatness trimming on the upper surface of the piezoelectric induction thin film, such that a ratio of a height of a micro protrusion or depression at the upper surface of the piezoelectric induction thin film to a thickness of the piezoelectric induction thin film is less than 0.1%;
the step of making the upper surface of the second sacrificial thin film be flush with the upper surface of the third dielectric layer comprises:

performing flatness trimming on the surface of the second sacrificial layer in the second groove by an ion beam trimming process, such that a ratio of a height of a micro protrusion or depression at the upper surface of the second sacrificial layer to a thickness of the second sacrificial layer is less than 0.1%.

17. The manufacturing method for the thin film piezoelectric acoustic wave resonator according to claim 13, wherein a thickness of the first sacrificial layer and a thickness of the second sacrificial layer are 0.1 nm to 5 microns; and/or
the upper electrode being an electrode after a conductive layer is patterned, the upper electrodes between each adjacent resonators being mutually disconnected, and a noneffective region and an effective region of the upper electrode being mutually disconnected, or
the upper electrode being the entire conductive layer, and after the lower electrode is formed, the manufacturing method further comprising:
forming a first dielectric layer to cover the lower electrode;
bonding a second substrate on the first dielectric layer and then removing the first substrate; and
patterning the entire conductive layer to form the upper electrode, the upper electrodes between each adjacent resonators being mutually disconnected, and the noneffective region and the effective region of the upper electrode being mutually disconnected.

18. The manufacturing method for the thin film piezoelectric acoustic wave resonator according to claim 17, wherein the method for removing the first sacrificial layer, the second sacrificial layer and the third sacrificial layer comprises:
forming at least one through hole penetrating through a film layer above a sacrificial layer away from the remained substrate, converting the first sacrificial layer, the second sacrificial layer and the third sacrificial layer into volatile gas through gas phase chemical reaction to be discharged from the through hole, or dissolving the first sacrificial layer or the second sacrificial layer into a solution through a liquid chemical reaction to be discharged from the through hole;
after the step of removing the first sacrificial layer, the second sacrificial layer and the third sacrificial layer, the manufacturing method further comprising:
forming a cap layer on a surface of the electrode where the through hole is formed, the cap layer filling the through hole;
a material of the cap layer comprises an organic cured film or silicon dioxide, and a thickness of the cap layer is 0.2 microns to 30 microns.

19. The manufacturing method for the thin film piezoelectric acoustic wave resonator according to claim 13, at the periphery of a region surrounded by the isolation cavity, the first gap and the second gap, the upper electrode and the lower electrode being staggered at a side where the part of the edge is located, an opposite side of the part of the edge being provided with an opposite part, and
the method further comprising:
forming a first conductive plug which is connected to the upper electrode at the staggered side and penetrates through a structure above the upper electrode on the other side, opposite to the base, of the upper electrode; and
forming a second conductive plug which is connected to the lower electrode at the side with the opposite part and penetrates through the structure above the upper electrode on the other side, opposite to the base, of the lower electrode; and/or
a first active micro-device and/or a first passive micro-device being embedded in the remained substrate;
the method further comprising:
forming a third conductive plug, wherein one end of the third conductive plug is connected to the first active micro-device and/or the first passive micro-device, and the other end of the third conductive plug penetrates through a structure above the micro-device; or the other end of the third conductive plug is connected to the upper electrode or the lower electrode.

20. The manufacturing method for the thin film piezoelectric acoustic wave resonator according to claim 13, wherein the step of forming the laminated structure comprises:
forming the second sacrificial layer on the upper electrode;
forming a piezoelectric induction thin film to cover the upper electrode, the second sacrificial layer and the first substrate;
patterning the piezoelectric induction thin film to form a trench for disconnecting the piezoelectric induction thin film, the bottom of the trench exposing part of the second sacrificial layer, and a part of the piezoelectric induction thin film not disconnected by the trench forming the connecting bridge;
forming the third sacrificial layer in the trench, the upper surface of the third sacrificial layer being flush with the upper surface of the piezoelectric plate body;
forming a first sacrificial thin film to cover the third sacrificial layer and the piezoelectric induction thin film; and
patterning the first sacrificial thin film and removing the first sacrificial thin film outside a second region, the second region being located in the effective working region, and the first sacrificial thin film of the second region forming the first sacrificial layer.

* * * * *